United States Patent
Von Wendorff (10) Patent No.: US 7,131,051 B2
(45) Date of Patent: Oct. 31, 2006

(54) CODING METHOD FOR CODING CONTROL COMMANDS FOR ACTUATORS AND ACTUATOR CONTROL UNIT FOR CONTROLLING ACTUATORS

(75) Inventor: Wilhard Von Wendorff, München (DE)

(73) Assignee: Infineon Technologies AG, Munich (DE)

(*) Notice: Subject to any disclaimer, the term of this patent is extended or adjusted under 35 U.S.C. 154(b) by 205 days.

(21) Appl. No.: 10/195,729

(22) Filed: Jul. 15, 2002

(65) Prior Publication Data

US 2003/0033036 A1    Feb. 13, 2003

Related U.S. Application Data

(63) Continuation of application No. PCT/DE00/04640, filed on Dec. 21, 2000.

(30) Foreign Application Priority Data

Jan. 14, 2000    (DE) ................. 100 01 395

(51) Int. Cl.
*H03M 13/00*    (2006.01)
(52) U.S. Cl. ........................... 714/774
(58) Field of Classification Search ............ 714/774
See application file for complete search history.

(56) References Cited

U.S. PATENT DOCUMENTS

| | | | | |
|---|---|---|---|---|
| 3,496,549 A | * | 2/1970 | Tong | 714/774 |
| 4,701,923 A | * | 10/1987 | Fukasawa et al. | 714/774 |
| 4,773,072 A | | 9/1988 | Fennel | |
| 4,992,928 A | * | 2/1991 | Ishihara et al. | 700/78 |
| 5,357,614 A | * | 10/1994 | Pattisam et al. | 710/68 |
| 5,648,897 A | * | 7/1997 | Johnson et al. | 700/83 |
| 5,746,060 A | * | 5/1998 | Sunaga et al. | 62/126 |
| 5,862,502 A | | 1/1999 | Giers | |
| 6,182,264 B1 | * | 1/2001 | Ott | 714/774 |
| 6,223,324 B1 | * | 4/2001 | Sinha et al. | 714/776 |

FOREIGN PATENT DOCUMENTS

| | | |
|---|---|---|
| EP | 0 432 764 A1 | 6/1991 |
| EP | 0 820 152 A1 | 1/1998 |
| JP | 02260934 | 10/1990 |

OTHER PUBLICATIONS

Stephen B. Wicker, "Error Control Systems for Digital Communications and Storage", Prentice-Hall, 1995.*
Granström, K. et al.: "Unequal Error Protection Codes", IEEE, Jun. 13, 1988, pp. 174-176.

* cited by examiner

*Primary Examiner*—Joseph Torres
(74) *Attorney, Agent, or Firm*—Laurence A. Greenberg; Werner H. Stemer; Ralph E. Locher (57) ABSTRACT

A coding method for coding control commands for actuators includes a system that is sensitive to data transmission errors and determines a degree of danger for the system by using a system control unit. A current transmission control command is coded to form a control command code word, by using the system control device, whereby the redundancy of the control command code word depends on the determined degree of danger. The control command code word from the system control device is transmitted to an actuator control unit and decoded to form a receiving control command. The receiving control command is checked for transmission errors and at least one actuator for carrying out the receiving control command is controlled when no transmission error is detected. An actuator control unit conducts the method.

3 Claims, 11 Drawing Sheets

Format of the control command code word

| | | | | |
|---|---|---|---|---|
| Valve control (high risk potential) | 1 Bit Opcode | 9 Bit Valve position | 5 Bit K{SB, SB$_{old}$} | |
| Valve control (normal risk potential) | 1 Bit Opcode | 11 Bit Valve control | 4 Bit K{SB, SB$_{old}$} | |
| Status enquiry | 3 Bit Opcode | 4 Bit Address of the status register | 9 Bit Not used | |
| Configuration control | 3 Bit Opcode | 8 Bit Configuration | 5 Bit K{SB, SB$_{old}$} | |
| PWM control | 2 Bit Opcode | 2 Bit Valve number | 8 Bit PWM | 4 Bit K{SB, SB$_{old}$} |

FIG 4B

Format of the return value

| | | | | |
|---|---|---|---|---|
| PWM control | 1 Bit Error status | 5 Bit K{SB, SB$_{old}$} | 2 Bit Valve number | 8 Bit PWM |
| Valve control | 1 Bit Error status | 5 Bit K{SB, SB$_{old}$} | 10 Bit Valve status | |
| Status enquiry | 1 Bit Error status | 5 Bit K{SB, SB$_{old}$} | 10 Bit Status | |
| Configuration control | 1 Bit Error status | 5 Bit K{SB, SB$_{old}$} | 2 Bit Error class | 8 Bit Configuration |

FIG 4C(1)

| Coding | Code Bits | K{} Bits | Wheel 1 | Wheel 2 | Wheel 3 | Wheel 4 | Risk potential | Inlet valve wheel 1 | Outlet valve wheel 1 | Inlet valve wheel 2 | Outlet valve wheel 2 | Inlet valve wheel 3 | Outlet valve wheel 3 | Inlet valve wheel 4 | Outlet valve wheel 4 |
|---|---|---|---|---|---|---|---|---|---|---|---|---|---|---|---|
| 10000000vvvvcccc | 11 | 4 | Brake | Brake | Brake | Hold pressure | 3 wheels normal braking function (low) | open | shut | open | shut | open | shut | shut | shut |
| 10000001vvvvcccc | 11 | 4 | Brake | Brake | Hold pressure | Brake | | open | shut | open | shut | shut | shut | open | shut |
| 10000010vvvvcccc | 11 | 4 | Brake | Hold pressure | Brake | Brake | | open | shut | shut | shut | open | shut | open | shut |
| 10000011vvvvcccc | 11 | 4 | Hold pressure | Brake | Brake | Brake | | shut | shut | open | shut | open | shut | open | shut |
| 10000100vvvvcccc | 11 | 4 | Brake | Brake | Brake | Reduce pressure | | open | shut | open | shut | open | shut | shut | open |
| 10000101vvvvcccc | 11 | 4 | Brake | Brake | Reduce pressure | Brake | | open | shut | open | shut | shut | open | open | shut |
| 10000110vvvvcccc | 11 | 4 | Brake | Reduce pressure | Brake | Brake | | open | shut | shut | open | open | shut | open | shut |
| 10000111vvvvcccc | 11 | 4 | Reduce pressure | Brake | Brake | Brake | | shut | open | open | shut | open | shut | open | shut |
| 10100000vvvvcccc | 11 | 4 | Brake | Hold pressure | Hold pressure | Hold pressure | 1 wheel normal braking function (low) | open | shut | shut | shut | shut | shut | shut | shut |
| 10100001vvvvcccc | 11 | 4 | Hold pressure | Brake | Hold pressure | Hold pressure | | shut | shut | open | shut | shut | shut | shut | shut |
| 10100010vvvvcccc | 11 | 4 | Hold pressure | Hold pressure | Brake | Hold pressure | | shut | shut | shut | shut | open | shut | shut | shut |
| 10100011vvvvcccc | 11 | 4 | Hold pressure | Hold pressure | Hold pressure | Brake | | shut | shut | shut | shut | shut | shut | open | shut |
| 10100100vvvvcccc | 11 | 4 | Brake | Hold pressure | Hold pressure | Reduce pressure | | open | shut | shut | shut | shut | shut | shut | open |
| 10100101vvvvcccc | 11 | 4 | Brake | Hold pressure | Reduce pressure | Hold pressure | | open | shut | shut | shut | shut | open | shut | shut |
| 10100110vvvvcccc | 11 | 4 | Brake | Reduce pressure | Hold pressure | Hold pressure | | open | shut | shut | open | shut | shut | shut | shut |

FIG 4C(2)

| Coding | Code Bits | K() Bits | Wheel 1 | Wheel 2 | Wheel 3 | Wheel 4 | Risk potential | Inlet valve wheel 1 | Outlet valve wheel 1 | Inlet valve wheel 2 | Outlet valve wheel 2 | Inlet valve wheel 3 | Outlet valve wheel 3 | Inlet valve wheel 4 | Outlet valve wheel 4 |
|---|---|---|---|---|---|---|---|---|---|---|---|---|---|---|---|
| 10100111vvvvccccc | 11 | 4 | Hold pressure | Brake | Hold pressure | Reduce pressure | | shut | shut | open | shut | shut | shut | shut | open |
| 10101000vvvvccccc | 11 | 4 | Hold pressure | Brake | Reduce pressure | Hold pressure | | shut | shut | open | shut | shut | open | shut | shut |
| 10101001vvvvccccc | 11 | 4 | Reduce pressure | Brake | Hold pressure | Hold pressure | | shut | open | open | shut | shut | shut | shut | open |
| 10101010vvvvccccc | 11 | 4 | Hold pressure | Hold pressure | Brake | Reduce pressure | | shut | shut | shut | shut | open | shut | shut | shut |
| 10101011vvvvccccc | 11 | 4 | Hold pressure | Reduce pressure | Brake | Hold pressure | | shut | shut | shut | open | open | shut | shut | shut |
| 10101100vvvvccccc | 11 | 4 | Reduce pressure | Hold pressure | Brake | Hold pressure | | shut | open | shut | shut | open | shut | shut | shut |
| 10101101vvvvccccc | 11 | 4 | Hold pressure | Hold pressure | Reduce pressure | Brake | | shut | shut | shut | shut | shut | open | shut | shut |
| 10101110vvvvccccc | 11 | 4 | Hold pressure | Reduce pressure | Hold pressure | Brake | | shut | shut | shut | open | shut | shut | shut | shut |
| 10101111vvvvccccc | 11 | 4 | Reduce pressure | Hold pressure | Hold pressure | Brake | | shut | open | shut | shut | shut | shut | shut | shut |
| 10110000vvvvccccc | 11 | 4 | Brake | Reduce pressure | Reduce pressure | Hold pressure | | open | shut | open | shut | shut | open | shut | shut |
| 10110001vvvvccccc | 11 | 4 | Brake | Reduce pressure | Hold pressure | Reduce pressure | | open | shut | open | shut | shut | shut | shut | open |
| 10110010vvvvccccc | 11 | 4 | Brake | Hold pressure | Reduce pressure | Reduce pressure | | open | shut | shut | shut | shut | open | shut | open |
| 10110011vvvvccccc | 11 | 4 | Reduce pressure | Brake | Reduce pressure | Hold pressure | | shut | open | open | shut | shut | open | shut | shut |
| 10110100vvvvccccc | 11 | 4 | Hold pressure | Brake | Reduce pressure | Reduce pressure | | shut | shut | open | shut | shut | open | shut | open |
| 10110101vvvvccccc | 11 | 4 | Reduce pressure | Brake | Hold pressure | Reduce pressure | | shut | open | open | shut | shut | shut | shut | open |
| 10110110vvvvccccc | 11 | 4 | Reduce pressure | Hold pressure | Brake | Reduce pressure | | shut | open | shut | shut | open | shut | shut | open |

FIG 4C(3)

| Coding | Code Bits | K{} Bits | Wheel 1 | Wheel 2 | Wheel 3 | Wheel 4 | Risk potential | Inlet valve wheel 1 | Outlet valve wheel 1 | Inlet valve wheel 2 | Outlet valve wheel 2 | Inlet valve wheel 3 | Outlet valve wheel 3 | Inlet valve wheel 4 | Outlet valve wheel 4 |
|---|---|---|---|---|---|---|---|---|---|---|---|---|---|---|---|
| 1011011 1wwvcccc | 11 | 4 | Reduce pressure | Reduce pressure | Brake | Hold pressure | | shut | open | shut | open | open | shut | shut | shut |
| 10111000wwvcccc | 11 | 4 | Hold pressure | Reduce pressure | Brake | Reduce pressure | | shut | shut | shut | open | open | shut | open | open |
| 10111001wwvcccc | 11 | 4 | Reduce pressure | Reduce pressure | Hold pressure | Brake | | shut | open | shut | open | shut | shut | shut | shut |
| 10111010wwvcccc | 11 | 4 | Reduce pressure | Hold pressure | Reduce pressure | Brake | | shut | open | shut | shut | shut | open | shut | shut |
| 10111011wwvcccc | 11 | 4 | Hold pressure | Reduce pressure | Reduce pressure | Brake | | shut | shut | shut | open | shut | open | shut | shut |
| 10111100wwvcccc | 11 | 4 | Brake | Reduce pressure | Reduce pressure | Reduce pressure | | open | shut | shut | open | shut | open | shut | open |
| 10111101wwvcccc | 11 | 4 | Reduce pressure | Brake | Reduce pressure | Reduce pressure | | shut | open | open | shut | shut | open | shut | open |
| 10001000wwvcccc | 11 | 4 | Brake | Brake | Hold pressure | Hold pressure | 2 front wheels normal braking function (low) | open | shut | open | shut | shut | shut | shut | shut |
| 10001001wwvcccc | 11 | 4 | Brake | Brake | Hold pressure | Reduce pressure | | open | shut | open | shut | shut | shut | shut | open |
| 10001010wwvcccc | 11 | 4 | Brake | Brake | Reduce pressure | Hold pressure | | open | shut | open | shut | shut | open | shut | shut |
| 10001011wwvcccc | 11 | 4 | Brake | Brake | Reduce pressure | Reduce pressure | | open | shut | open | shut | shut | open | shut | open |
| 10001100wwvcccc | 11 | 4 | Hold pressure | Hold pressure | Brake | Brake | 2 rear wheels normal braking function (low) | shut | shut | shut | shut | open | shut | open | shut |
| 10001101wwvcccc | 11 | 4 | Reduce pressure | Hold pressure | Brake | Brake | | shut | open | shut | shut | open | shut | open | shut |
| 10001110wwvcccc | 11 | 4 | Hold pressure | Reduce pressure | Brake | Brake | | shut | shut | shut | open | open | shut | open | shut |
| 10001111wwvcccc | 11 | 4 | Reduce pressure | Reduce pressure | Brake | Brake | | shut | open | shut | open | open | shut | open | shut |

FIG 4C(4)

| Coding | Code Bits | K{} Bits | Wheel 1 | Wheel 2 | Wheel 3 | Wheel 4 | Risk potential | Inlet valve wheel 1 | Outlet valve wheel 1 | Inlet valve wheel 2 | Outlet valve wheel 2 | Inlet valve wheel 3 | Outlet valve wheel 3 | Inlet valve wheel 4 | Outlet valve wheel 4 |
|---|---|---|---|---|---|---|---|---|---|---|---|---|---|---|---|
| 10010000vvvcccc | 11 | 4 | Brake | Hold pressure | Hold pressure | Brake | 1 left and 1 right wheel normal braking function (low) | open | shut | shut | shut | shut | shut | open | shut |
| 10010001vvvcccc | 11 | 4 | Hold pressure | Brake | Brake | Hold pressure | | shut | shut | open | open | shut | shut | shut | shut |
| 10010010vvvcccc | 11 | 4 | Brake | Hold pressure | Reduce pressure | Brake | | open | shut | shut | shut | shut | open | open | shut |
| 10010011vvvcccc | 11 | 4 | Brake | Reduce pressure | Hold pressure | Reduce pressure | | open | shut | shut | open | shut | shut | shut | open |
| 10010100vvvcccc | 11 | 4 | Hold pressure | Brake | Brake | Brake | | shut | shut | open | shut | shut | shut | open | shut |
| 10010101vvvcccc | 11 | 4 | Reduce pressure | Reduce pressure | Brake | Hold pressure | | shut | open | shut | open | open | shut | shut | shut |
| 10010110vvvcccc | 11 | 4 | Brake | Reduce pressure | Reduce pressure | Brake | | shut | shut | shut | open | shut | open | open | shut |
| 10010111vvvcccc | 11 | 4 | Reduce pressure | Brake | Brake | Reduce pressure | | shut | open | open | open | shut | shut | shut | open |
| 10011000vvvcccc | 11 | 4 | Brake | Hold pressure | Brake | Hold pressure | 2 left and right wheels normal braking function (low) | open | shut | shut | shut | open | shut | shut | shut |
| 10011001vvvcccc | 11 | 4 | Hold pressure | Brake | Hold pressure | Brake | | shut | shut | open | shut | shut | shut | open | shut |
| 10011010vvvcccc | 11 | 4 | Brake | Brake | Brake | Reduce pressure | | open | shut | open | shut | open | shut | shut | open |
| 10011011vvvcccc | 11 | 4 | Brake | Reduce pressure | Brake | Hold pressure | | open | shut | shut | open | open | shut | shut | shut |
| 10011100vvvcccc | 11 | 4 | Brake | Reduce pressure | Brake | Reduce pressure | | open | shut | shut | open | open | shut | shut | open |
| 10011101vvvcccc | 11 | 4 | Hold pressure | Brake | Hold pressure | Brake | | shut | shut | open | shut | shut | shut | open | shut |
| 10011110vvvcccc | 11 | 4 | Reduce pressure | Brake | Reduce pressure | Brake | | shut | open | open | shut | shut | open | open | shut |
| 10011111vvvcccc | 11 | 4 | Reduce pressure | Brake | Reduce pressure | Brake | | shut | open | open | shut | shut | open | open | shut |

FIG 4C(5)

| Coding | Code Bits | K{} Bits | Wheel 1 | Wheel 2 | Wheel 3 | Wheel 4 | Risk potential | Inlet valve wheel 1 | Outlet valve wheel 1 | Inlet valve wheel 2 | Outlet valve wheel 2 | Inlet valve wheel 3 | Outlet valve wheel 3 | Inlet valve wheel 4 | Outlet valve wheel 4 |
|---|---|---|---|---|---|---|---|---|---|---|---|---|---|---|---|
| 1011110vvvvcccc | 11 | 4 | Reduce pressure | Reduce pressure | Brake | Reduce pressure | | shut | open | shut | open | open | shut | shut | open |
| 1011111vvvvcccc | 11 | 4 | Reduce pressure | Reduce pressure | Reduce pressure | Brake | | shut | open | shut | open | shut | open | open | shut |
| 110000vvvvcccccc | 9 | 6 | Hold pressure | Hold pressure | Hold pressure | Hold pressure | 0 wheel normal braking function (high) | shut | shut | shut | shut | shut | shut | shut | shut |
| 110001vvvvcccccc | 9 | 6 | Hold pressure | Hold pressure | Hold pressure | Reduce pressure | | shut | shut | shut | shut | shut | shut | shut | open |
| 110010vvvvcccccc | 9 | 6 | Hold pressure | Hold pressure | Reduce pressure | Hold pressure | | shut | shut | shut | shut | shut | open | shut | shut |
| 110011vvvvcccccc | 9 | 6 | Hold pressure | Hold pressure | Reduce pressure | Reduce pressure | | shut | shut | shut | shut | shut | open | shut | open |
| 110100vvvvcccccc | 9 | 6 | Hold pressure | Reduce pressure | Hold pressure | Hold pressure | | shut | shut | shut | open | shut | shut | shut | shut |
| 110101vvvvcccccc | 9 | 6 | Hold pressure | Reduce pressure | Hold pressure | Reduce pressure | | shut | shut | shut | open | shut | shut | shut | open |
| 110110vvvvcccccc | 9 | 6 | Reduce pressure | Reduce pressure | Hold pressure | Hold pressure | | shut | open | shut | open | shut | shut | shut | shut |
| 110111vvvvcccccc | 9 | 6 | Hold pressure | Reduce pressure | Reduce pressure | Hold pressure | | shut | shut | shut | open | shut | open | shut | shut |

FIG 4C(6)

| Coding | Code Bits | K{} Bits | Wheel 1 | Wheel 2 | Wheel 3 | Wheel 4 | Risk potential | Inlet valve wheel 1 | Outlet valve wheel 1 | Inlet valve wheel 2 | Outlet valve wheel 2 | Inlet valve wheel 3 | Outlet valve wheel 3 | Inlet valve wheel 4 | Outlet valve wheel 4 |
|---|---|---|---|---|---|---|---|---|---|---|---|---|---|---|---|
| 111000vvvccccc | 9 | 6 | Reduce pressure | Hold pressure | Reduce pressure | Hold pressure | | shut | open | shut | shut | shut | open | shut | shut |
| 111001vvvccccc | 9 | 6 | Reduce pressure | Hold pressure | Hold pressure | Reduce pressure | | shut | open | shut | shut | shut | shut | shut | open |
| 111010vvvccccc | 9 | 6 | Hold pressure | Reduce pressure | Reduce pressure | Reduce pressure | | shut | shut | shut | open | shut | shut | shut | open |
| 111011vvvccccc | 9 | 6 | Hold pressure | Reduce pressure | Reduce pressure | Reduce pressure | | shut | shut | shut | open | shut | open | shut | open |
| 111100vvvccccc | 9 | 6 | Reduce pressure | Hold pressure | Reduce pressure | Reduce pressure | | shut | open | shut | shut | shut | shut | shut | open |
| 111101vvvccccc | 9 | 6 | Reduce pressure | Reduce pressure | Hold pressure | Reduce pressure | | shut | open | shut | open | shut | shut | shut | open |
| 111110vvvccccc | 9 | 6 | Reduce pressure | Reduce pressure | Reduce pressure | Hold pressure | | shut | open | shut | open | shut | open | shut | shut |
| 111111vvvccccc | 9 | 6 | Reduce pressure | Reduce pressure | Reduce pressure | Reduce pressure | | shut | open | shut | open | shut | open | shut | open |

CODING METHOD FOR CODING CONTROL COMMANDS FOR ACTUATORS AND ACTUATOR CONTROL UNIT FOR CONTROLLING ACTUATORS

CROSS-REFERENCE TO RELATED APPLICATION

This application is a continuation of copending International Application No. PCT/DE00/04640, filed Dec. 21, 2000, which designated the United States and was not published in English.

BACKGROUND OF THE INVENTION

Field of the Invention

The invention relates to a coding method for coding control commands for actuators and an actuator control unit for controlling actuators in systems that are sensitive to data transmission errors, particularly an antiblocking system.

There are various systems that are particularly sensitive to data transmission errors and in which a faulty data transmission can have grave consequences. An example of such a sensitive system is an antiblocking system of a vehicle. As a rule, an antiblocking system has sensors, an electronic controller and magnetic valves or pressure control valves. The magnetic valves represent the actuators of the antiblocking system. The electronic controller of the antiblocking system includes an input amplifier that processes the pulses from the sensors, a computer unit for calculating the control signals and a power output stage that drives the magnetic valves in the hydraulic unit. The actuators or valves are driven via control lines in a control bus. For this purpose, the electronic controller delivers control commands to the magnetic valves for closing or opening hydraulic braking circuits. To avoid transmission errors that can lead to severe accidents in such sensitive systems, the control commands are coded and provided with redundancy in order to detect transmission errors that, for example, are caused by electromagnetic interference at the end of the magnetic valves. The actuators or magnetic valves, respectively, receive pulse-width modulated control signals. So that the electromagnetic compatibility is not reduced due to the pulse-width modulated signals, the control signals are pulse-width modulated in the vicinity of the actuators by a decentralized actuator control unit that is connected to the central system control or the controller via a serial bus. The central system control delivers control command code words via the serial bus to the actuator control unit for controlling the actuators. The actuator control unit then generates the pulse-width-modulated control command signals for driving the magnetic valves.

However, because the serial bus between the central system control and the actuator control unit only has a limited transmission bandwidth, the control command code words cannot be coded with an arbitrarily high redundancy in order to increase the data reliability. The disadvantage of the previously-known coding methods for coding control commands for actuators lies in that all control commands are coded with the same redundancy independently of the degree to which they are liable to cause danger to the total system. But the faulty data transmission of control commands has different effects on the total system. In an ABS system for a four-wheel vehicle, one inlet valve and one outlet valve are driven per wheel, which makes a total of eight valves. The fewer the wheels that exert a normal breaking function due to the valve position, the higher the degree of risk in the case of an erroneously interpreted further control command for driving the valves and the higher the data reliability has to be. In the previous coding methods, such critical system states are not taken into consideration in the coding of further control commands.

SUMMARY OF THE INVENTION

It is accordingly an object of the invention to provide a coding method for coding control commands for actuators and an actuator control unit for controlling actuators that overcomes the hereinafore-mentioned disadvantages of the heretofore-known devices of this general type and that guarantees increased reliability for control commands that are particularly critical for the safety of the system. With the foregoing and other objects in view, there is provided, in accordance with the invention, a coding method for coding control commands for actuators with a system sensitive to data transmission errors. The first step of the method is determining a degree of danger of a current transmit control command to the system by using a system control. The next step is coding the current transmit control command to form a control command code word by using the system control. A redundancy of the control command code word depends on the degree of danger to the system passed by the current transmit control command. The next step is transmitting the control command code word from the system control to an actuator control unit. The next step is decoding the transmitted control command code word with the actuator control unit to form a received control command. The next step is checking the received control command for transmission errors. The next step is driving at least one actuator for carrying out the received control command SB' when no transmission errors are found.

With the objects of the invention in view, there is also provided an actuator control unit for controlling actuators in a system sensitive to data transmission errors. The actuator control unit includes a transmitting and receiving device, a decoding device, a memory, a data compression circuit, and a data comparison circuit. The transmitting and receiving device connects to a serial bus. The decoding device decodes control command code words SBC transmitted via the serial bus. The control command code words SBC have an encoded redundancy depending on a degree of danger to the system posed by the coded control command SB. The memory stores the decoded control commands. The data compression circuit compresses the stored control commands. The data comparison circuit compares whether a sequence of the control commands stored in the memory matches a sequence of control commands contained in the transmitted control command code words SBC.

The invention creates a coding message for coding control commands for actuators in a system sensitive to data transmission errors. A degree of danger of a current transmit control command for the total system is determined by a system control. The current transmit control command is coded into a control command code word by the system control. The coded redundancy of the control command code word depends on the degree of danger to the system. The control command code word is transmitted from the system control to an actuator control unit. The transmitted control command code word is decoded by the actuator control unit to form a received control command. The received control command is checked for transmission errors by the encoded redundancy. At least one actuator is driven for completing the received control command if no transmission error is found.

The system control preferably stores all transmit control commands previously transmitted to the actuator control unit. This offers the special advantage that the central system control can continuously track the current state of the actuator control units connected to it.

In a further preferred embodiment, the current transmit control command and the previous transmit control commands are compressed by the central system control. The compressed current control command and the compressed previous control commands for the actuator control unit are preferably coded by the system control to form the control command code word.

In a preferred embodiment, the actuator control unit stores the currently received and decoded received control command in a memory of the actuator control unit.

The current received control command and the previously received control commands are preferably compressed.

In a further preferred embodiment of the coding method according to the invention, the compressed current transmit control command and the compressed previous transmit control commands transmitted by the system control to the actuator control unit are compared with the compressed current received control command and the stored previous received control commands by a comparison circuit provided in the actuator control unit, which delivers the control signals to the actuators for carrying out the current received control command if these compressed control commands are identical.

The control signals delivered to the actuators are preferably pulse-width modulated.

In a further preferred embodiment, the control command code words are transmitted to the actuator control unit via a serial bus.

In a further preferred embodiment of the coding method according to the invention, the received control command code words serially transmitted are converted into parallel control command data by a serial/parallel converter contained in the actuator control unit.

The serial/parallel converted control command data are preferably decoded by a decoding device of the actuator control unit.

The control commands preferably include actuator setting commands, actuator status enquiry commands, and actuator configuration commands.

In a further preferred embodiment, the redundancy of a transmitted control command code word is increased with increasing degree of danger of the control command to the system.

In an especially preferred embodiment of the method according to the invention, the control command is coded by an error correction code.

In a further preferred embodiment, the coding method according to the invention codes control commands for actuators in an antiblocking system. The actuators are then preferably controllable valves.

In a further preferred embodiment, the degree of danger to the system sensitive to data transmission errors depends on the combination of switching states of the various actuators and is stored in table form in a memory of the system control.

Furthermore, the invention creates an actuator control unit for controlling actuators in a system sensitive to data transmission errors. The actuator control unit includes the following components. A transceiver device connects the actuator control unit to a serial bus. A decoding device decodes control command code words that are transmitted via the serial bus. The redundancy of the control command code words depends on the degree of danger of the coded control command to the system. A memory stores the decoded control commands. A data compression device compresses the control commands, and includes a data comparison circuit for checking the sequence of control commands transmitted from the system control to the actuator control unit.

Other features which are considered as characteristic for the invention are set forth in the appended claims.

Although the invention is illustrated and described herein as embodied in a coding method for coding control commands for actuators and an actuator control unit for controlling actuators, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
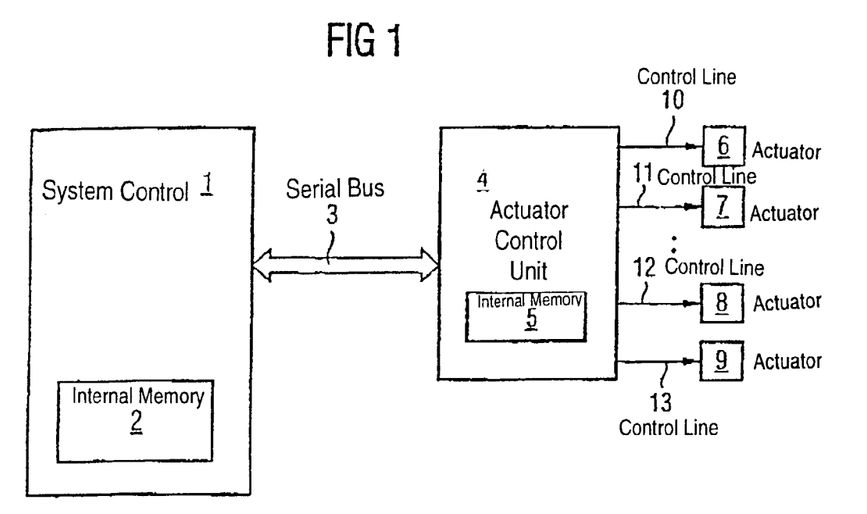
FIG. 1 is a block diagram showing an actuator control unit according to the invention connected to a system control via a serial bus.

Referring now to the figures of the drawings in detail and first, particularly to FIG. 1 thereof, there is shown a circuit with a central system control 1 of a data transmission system. The system control 1 contains an internal memory 2, for example a RAM memory. The central system control 1 is connected to a decentralized actuator control unit 4 for driving actuators via a serial bus 3. The actuator control unit 4 also contains an internal memory 5. In a preferred embodiment, the internal memory 5 includes a multiplicity of register components. The decentralized actuator control unit 4 controls a particular group of actuators within the total system, for example the magnetic control valves of an antiblocking system for a vehicle. The actuators 6, 7, 8, 9 are driven by the actuator control unit 4 via control lines 10, 11, 12, 13. The control signals are preferably transmitted pulse-width modulated.

In a preferred embodiment, the serial bus 3 includes four lines, namely of a first serial data line for transmitting data lines from the system control 1 to the actuator control unit 4, a second serial data transmission line for transmitting data from the actuator control unit 4 to the system control 1, a clock signal line and a selection control line for selecting an actuator control unit 4.

The example shown in FIG. 1 only represents one decentralized actuator control unit 4. In other embodiments, not shown, the central system control 1 is connected to a multiplicity of decentralized actuator control units 4 via the serial bus 3. Since the actual control command signals for driving the actuators 6, 7, 8, 9 are pulse-width modulated in the decentralized actuator control unit 4, the electromagnetic compatibility is high for data on the serial bus, i.e. the corruption of the transmitted command data due to electromagnetic radiation from one data line to another data line is largely avoided.

Figure 2A:
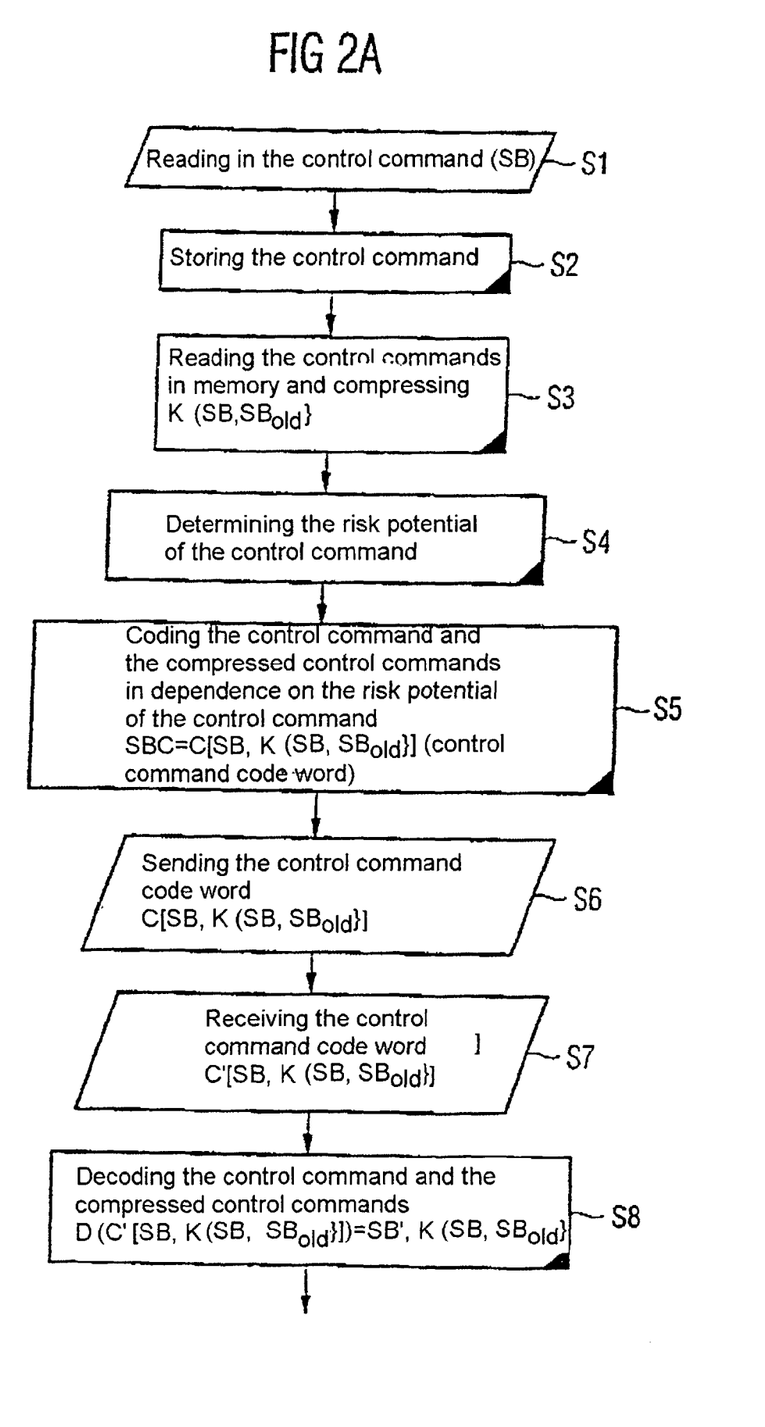
FIG. 2 is a flow chart showing a coding method according to the invention for coding control commands for actuators.
Figure 2B:
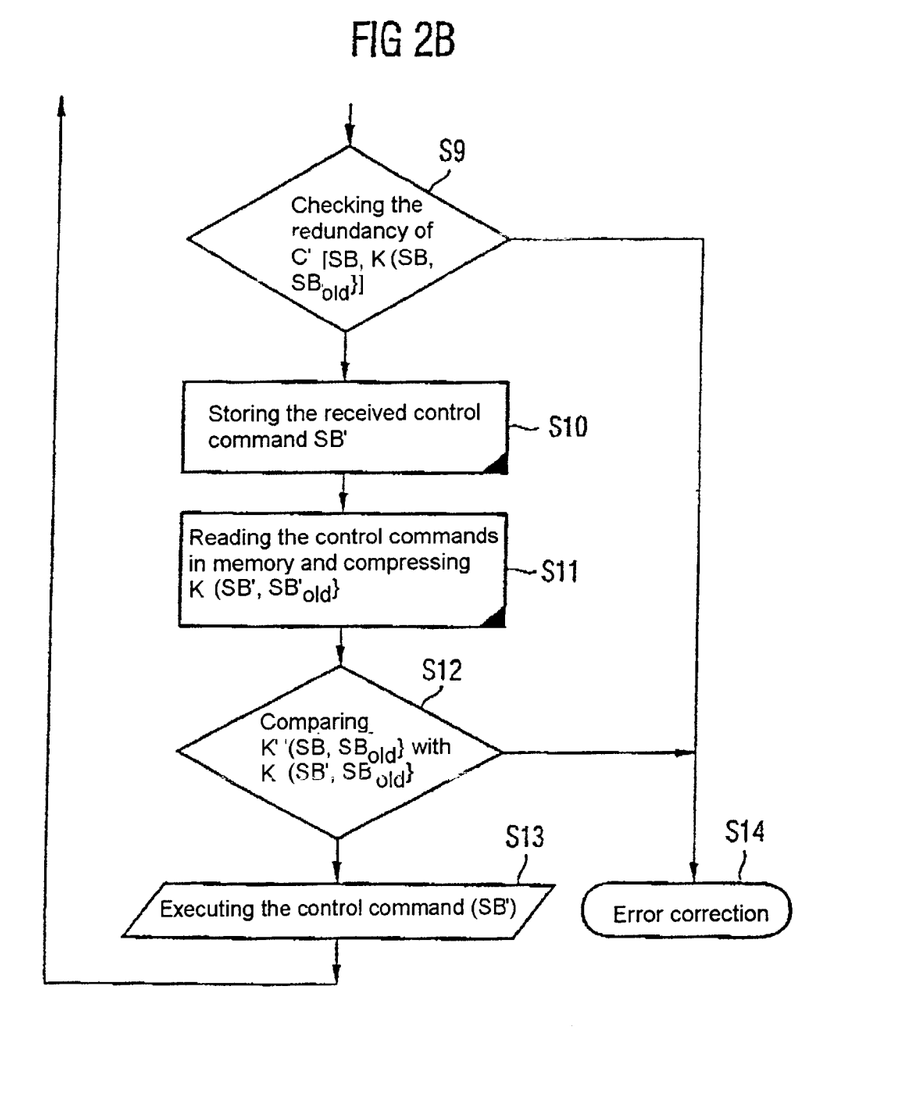

FIG. 2 shows a flow chart of the coding method according to the invention for coding control commands for actuators in a system sensitive to data transmission errors.

In a step S1, the system control 1 reads in a control command to be executed.

The control command SB to be executed is stored in the internal memory 2 in step S2.

In a step S3, all "old" control commands previously transmitted to the particular actuator control unit 4 are read from $SB_{old}$ in the memory 2 and are compressed, together with the control command SB currently to be transmitted to the actuator control unit 4, to form $K(SB,SB_{old})$.

In step S4, the degree of danger of the current control command to be transmitted to the actuator control unit 4 to the total system is then determined by the central control 1. The more disadvantageous the effect of a faulty transmission of the control command to the actuator control unit 4 on the total system, the higher the degree of danger of the control command. If, for example, a faulty transmission of the control command and thus a faulty execution or non-execution of the control command leads to an accident of the total system, the control command thus had a very high degree of danger and its faultless data transmission must be secured at all costs.

In step S5, the current control command SB and the control commands that were previously read and transmitted to the actuator control unit 4 are coded in compressed form depending on the established degree of danger of the control command to the total system, to form a control command code word SBC.

$$SBC=C[SB,K\{SB,SB_{old}\}]$$

In step S6, the control command code word SBC is then sent to the actuator control unit 4 via the serial bus from the system control 1.

In step S7, the actuator control unit 4 receives the transmitted control command code word SBC.

In step S8, the received control command code word SBC and the compressed transmitted previous control commands are decoded.

$$D(C'[SB,K\{SB,SB_{old}\}])=SB',K'\{SB,SB_{old}\}$$

Following this, the received control command and the decoded compressed old control commands previously transmitted to the actuator control unit 4 are checked for transmission errors in step S9 by reviewing the redundant data transmitted.

If the actuator control unit 4 in step S9 detects a transmission error, the error is recovered in step S14.

If no transmission error is found in step S9, the received current control command SB is stored in the internal memory 5 of the actuator control unit 4 in step S10.

In step S11, the control commands stored in the memory 5, i.e. the currently stored control command SB' and the previously received control commands $SB'_{old}$ are read out and then compressed.

In step S12, the information contained in the decoded control command code word with respect to the control commands $K'\{SB,SB_{old}\}$ hitherto transmitted to the actuator control unit 4 is compared with the control commands read out in step S11 and compressed. If the comparison in step S12 results in a match, the currently received control command is executed in step S13 in that the actuator control unit 4 delivers control signals to the actuators 6, 7, 8, 9 via the control signal line 10, 11, 12, 13.

If, conversely, the comparison finds no match in step S12, the error is corrected in step S14.

Because the system control 1 stores the sequence of transmit control commands that it has previously delivered to the actuator control unit 4 and delivers it compressed and coded as information within the control command code word to this actuator control unit 4 with each new control command, the actuator control unit. 4 can check itself with the comparison whether it is in the desired state. If the sequence of control commands stored in the internal memory 2 of the system control 1 differs from the sequence stored in the internal memory 5 of the actuator control unit 4, the error is corrected in step S14. The error correction includes, for example, reporting with the actuator control unit 4 that the error or the deviation to the central system control 1 via the serial bus 3 whereupon the central system control 1 delivers a control command to the decentralized actuator control unit 4 in order to place the latter and possibly other actuator control units 4 into a defined stable state. Each transmitted control command code word SBC contains not only information on the control command currently to be executed but also information on the control command sequence hitherto executed by the actuator control unit 4. The central control 1 thus always contains in its internal memory 2 a status copy of all decentralized actuator control units 4 connected to it via the serial bus 3 so that the status of all decentralized actuator control units 4 always can be monitored without there having to be continuous return messages from the actuator control units 4 to the central system control 1.

Compressing the information on the history or previous sequence of transmitted control commands guarantees that the transmission bandwidth of the serial bus 3 is optimally utilized. The control commands transmitted to the actuator control unit 4 include actuator setting commands, actuator status enquiry commands, and actuator configuration commands.

The central control 1 codes the control commands in a coder by using an error correction code (ECC) or cyclic redundancy code (CRC). The coding imparts a data redundancy to the control command, the hamming distance of the transmitted control command code words being increased by the degree of danger to the total system by the control command to be transmitted. Using the copy of the control commands already transmitted to the various actuator control units 4, stored in the internal memory 2, which represent the overall status of the system, the central control 1 finds out the effect of the novel command on the system and whether a faulty data transmission of the control command can lead to a critical system status. The higher the degree of danger or the potential of danger to the total system by the control command to be transmitted, the higher the data redundancy imparted to the control command code word SBC is set. A control command that must be transmitted to the actuator control unit 4 with a high reliability because of data transmission errors is given a higher data redundancy by the coding device contained in the central control, than a control command the faulty data transmission of which endangers the total system to a lesser degree.

The central control 1 preferably contains a table in which a coded control command code word SBC is stored correlated with each control command in accordance with a class of danger to the total system. Because the critical control commands are always coded to have higher redundancy, the probability that they will be transmitted with errors to the actuator control unit 4 is very low, which increases the reliability of the total system.

Figure 4A:
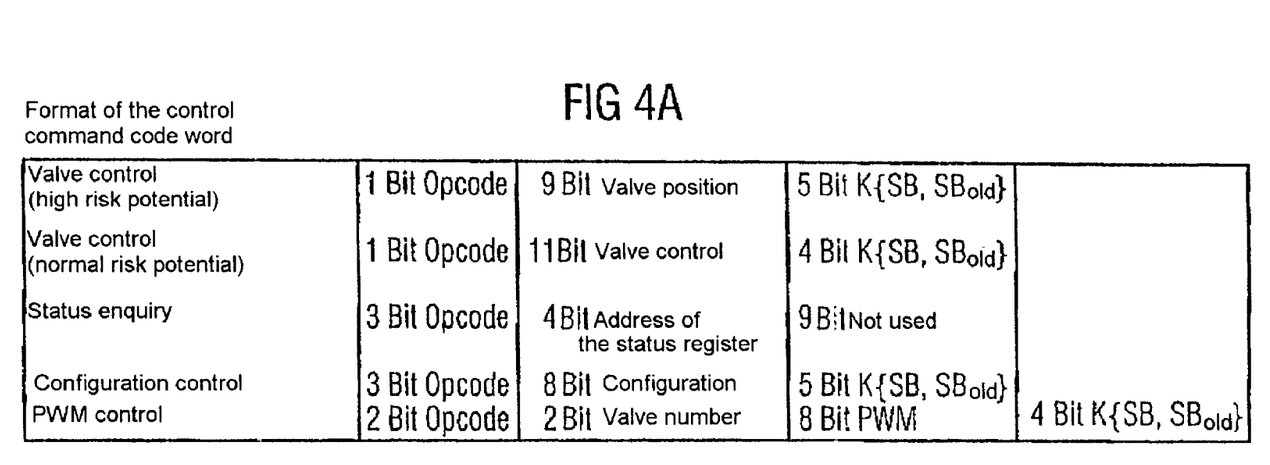
FIG. 4 is a table showing examples of the coding of control commands for driving inlet and outlet valves in an ABS system.
Figure 4B:
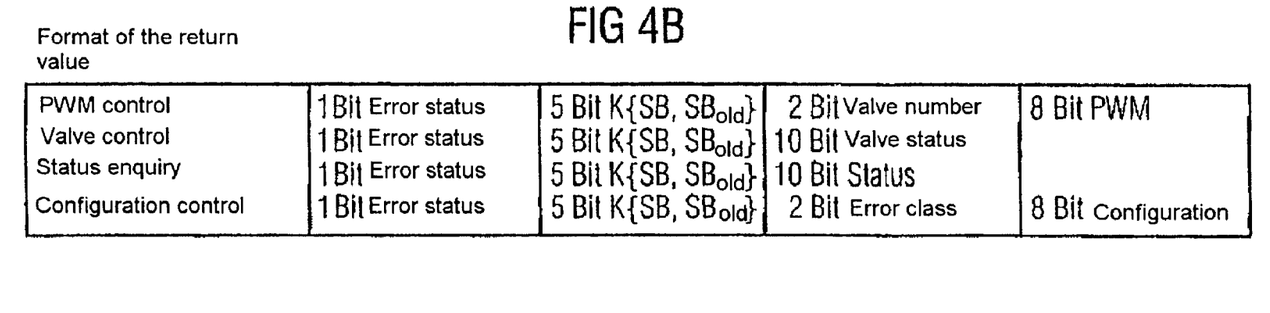
Figure 4C:
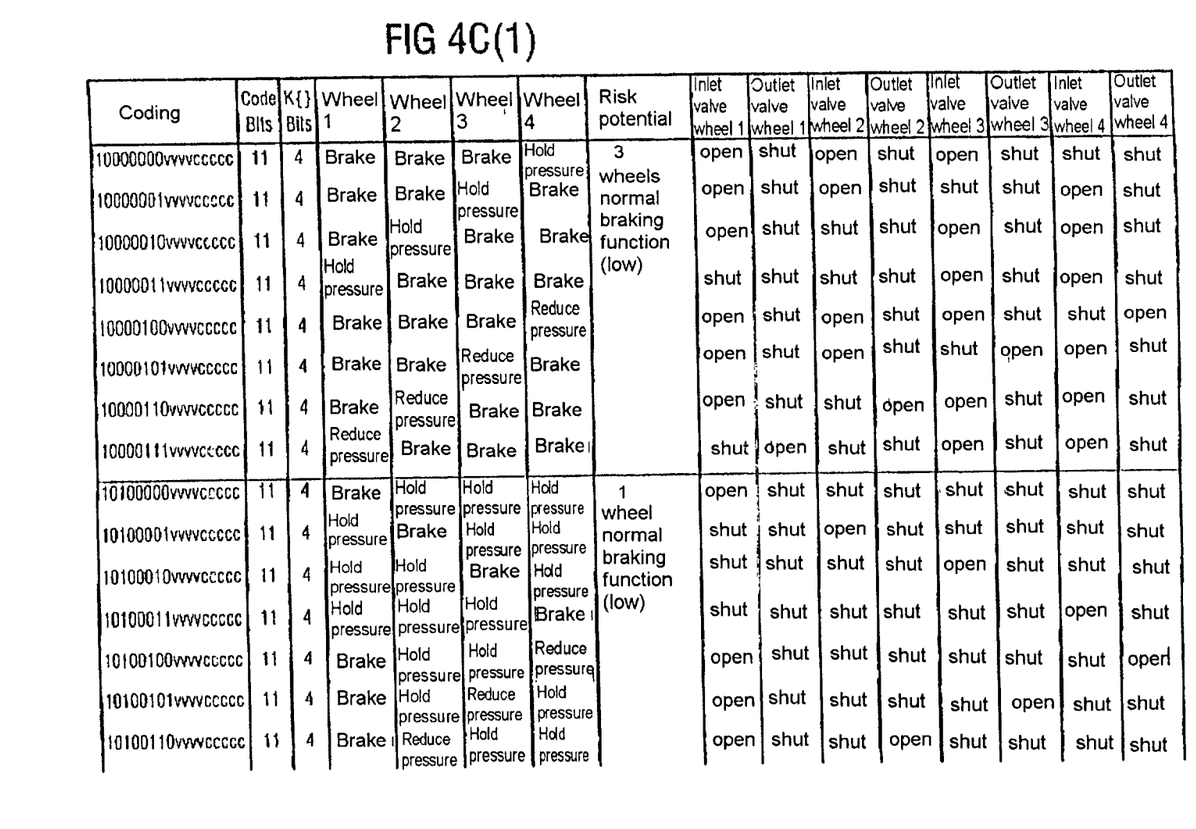

FIG. 4 shows tables for coding control commands for driving inlet and outlet valves in a motor vehicle ABS system.

Figure 3:
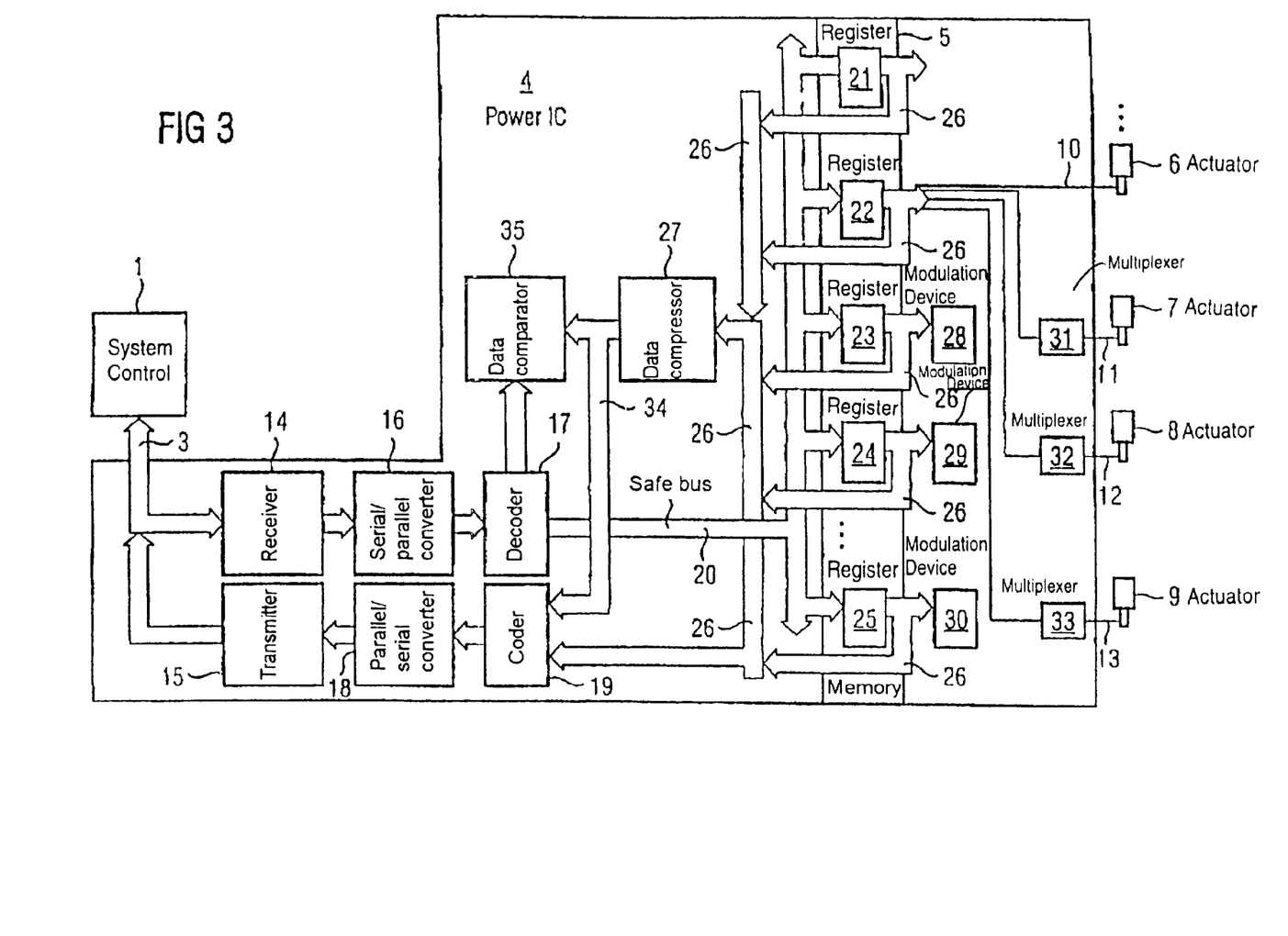
FIG. 3 is a partial diagrammatic and partial block diagram of a preferred embodiment of the actuator control unit according to the invention.

FIG. 3 shows a preferred embodiment of the actuator control unit 4 according to the invention. The serial bus 3 is connected to a serial data receiving device 14 and a serial transmitting device 15. The serial data-receiving device receives the received data supplied via the serial bus 3 and delivers them to a serial/parallel converter 15. The serial/parallel converter 15 converts the serial data stream and supplies it to a decoding device 17. Conversely, the serial transmitting device 15 receives serial data from a parallel/serial converter 18. The parallel/serial converter 18 receives the transmit data from an internal coding device 19 of the actuator control unit 4.

The decoder 17 is connected to the data input of various, registers 21, 22, 23, 24, 25 via an internal bus 20. The data outputs of the registers 21, 22, 23, 24, 25 are connected to the input of the coding device 19 and to the input of a data compression device 27 via an internal data bus 26. The storage registers 21–25 together form the internal memory 5 of the actuator control unit 4. The data outputs of the storage registers 21–25 are either connected directly to actuators via control signal lines or are connected to pulse width modulation devices 28, 29, 30. The pulse width modulation devices 28, 29, 30 are followed by multiplexers 31, 32, 33 for switching the output control signals in the example shown in FIG. 3.

The output of the data compression device 27 is connected to a further input of the coding device 19 and to an input of a data comparison circuit 35 via an internal bus 34. The data comparison circuit 35 is connected at the input end, on the one hand, to the data compression circuit 27 and at the output end to the decoding device 17.

The data-receiving device 14 receives the transmitted control command code words SBC in step S7 of the method according to the invention shown in FIG. 2. The control command code words received serially are converted into a parallel data format by the serial/parallel converter 16 and supplied to the decoding device 17, which decodes the control command code word in step S8. The received control command SB is stored in the storage registers 21–25 in step S10 and the previously-stored control commands are read out via the internal bus 26 and compressed by the data compression circuit 27. The data comparison circuit 35 then compares the compressed information on the control commands hitherto transmitted to the actuator control unit 4, contained in the decoded control command code word, with the control commands compressed by the data compression circuit 27 and read out of the storage registers 21–25. If the data comparison circuit 35 finds a match in step S12, the control commands are delivered to the actuators 6–9 via the control lines 10–13 for execution of the control command.

The actuator control unit 4 can deliver return code words back to the system control 1 via the serial bus 3 via the coder 19, the parallel/serial converter 18 and the transmitting device 15. Such return control code words are used for pulse width modulation control of the actuator status control, the status enquiry and the configuration control of the actuator control unit 4.

I claim:

1. A coding method for coding control commands for actuators with a system sensitive to data transmission errors, which comprises the following steps:
   determining a degree of danger of a current transmit control command to the system by using a system control;
   coding the current transmit control command to form a control command code word by using the system control, a redundancy of the control command code word depending on the degree of danger to the system passed by the current transmit control command, critical control commands for controlling the system being coded to have a higher redundancy;
   transmitting the control command code word from the system control to an actuator control unit;
   decoding the transmitted control command code word with the actuator control unit to form a received control command;
   checking the received control command for transmission errors;
   driving at least one actuator for carrying out the received control command when no transmission errors are found;
   storing in the system control all transmit control commands previously transmitted to the actuator control unit; and
   compressing the current transmit control command and the transmit control commands previously transmitted to the actuator control unit by using the system control before transmitting the current transmit control command and the transmit control commands previously transmitted to the actuator control unit.

2. The method according to claim 1, which further comprises coding the current transmit control command and the control commands previously transmitted to the actuator control unit by using the system control to form the control command code word before transmitting the current transmit control command and the transmit control commands previously transmitted to the actuator control unit.

3. A coding method for coding control commands for actuators with a system sensitive to data transmission errors, which comprises the following steps:
   determining a degree of danger of a current transmit control command to the system by using a system control;
   coding the current transmit control command to form a control command code word by using the system control, a redundancy of the control command code word depending on the degree of danger to the system passed by the current transmit control command, critical control commands for controlling the system being coded to have a higher redundancy;
   transmitting the control command code word from the system control to an actuator control unit;
   decoding the transmitted control command code word with the actuator control unit to form a received control command;
   checking the received control command for transmission errors;
   driving at least one actuator for carrying out the received control command when no transmission errors are found;

storing the received current and decoded received control command in a memory of the actuator control unit;

compressing the received control command with a data compression circuit in the actuator control unit;

comparing a sequence of decoded compressed control commands previously transmitted to the actuator control unit to the compressed control commands stored in the memory of the actuator unit by using a data, comparison circuit; and delivering control signals with the actuator control unit to the actuators for carrying out the control command currently received when the compressed control commands previously transmitted to the actuator control unit are identical with the compressed control command stored in the memory.

* * * * *